(12) United States Patent
Solomko et al.

(10) Patent No.: US 10,333,510 B2
(45) Date of Patent: Jun. 25, 2019

(54) SYSTEM AND METHOD FOR BIASING AN RF SWITCH

(71) Applicant: Infineon Technologies AG, Neubiberg (DE)

(72) Inventors: Valentyn Solomko, Munich (DE); Winfried Bakalski, Munich (DE); Andrea Cattaneo, Taufkirchen (DE); Bernd Schleicher, Ebersberg (DE); Anton Steltenpohl, Munich (DE); Hans Taddiken, Munich (DE); Danial Tayari, Unterhaching (DE)

(73) Assignee: INFINEON TEHCNOLOGIES AG, Neubiberg (DE)

( * ) Notice: Subject to any disclaimer, the term of this patent is extended or adjusted under 35 U.S.C. 154(b) by 0 days.

(21) Appl. No.: 15/644,435

(22) Filed: Jul. 7, 2017

(65) Prior Publication Data

US 2019/0013806 A1   Jan. 10, 2019

(51) Int. Cl.
*H03K 17/16*   (2006.01)

(52) U.S. Cl.
CPC .................................. *H03K 17/162* (2013.01)

(58) Field of Classification Search
CPC .... H03K 17/16; H03K 17/161; H03K 17/162; H03K 17/14; H03K 17/145
See application file for complete search history.

(56) References Cited

U.S. PATENT DOCUMENTS

| | | | | |
|---|---|---|---|---|
| 4,544,854 | A * | 10/1985 | Ulmer | H03K 17/6872 327/388 |
| 6,172,556 | B1 * | 1/2001 | Prentice | G05F 3/262 327/543 |
| 6,636,083 | B1 * | 10/2003 | Wong | G11C 27/026 327/307 |
| 6,730,953 | B2 * | 5/2004 | Brindle | H01L 27/0203 257/296 |
| 7,564,103 | B2 | 7/2009 | Losehand et al. | |
| 7,642,814 | B2 | 1/2010 | Hu | |
| 7,683,676 | B2 * | 3/2010 | Ide | H03F 3/087 327/427 |
| 7,995,413 | B2 * | 8/2011 | Genevaux | G11C 7/08 365/154 |
| 8,131,225 | B2 | 3/2012 | Botula et al. | |
| 8,854,111 | B2 | 10/2014 | Chih-Sheng | |
| 9,379,694 | B2 * | 6/2016 | den Besten | H03K 17/005 |
| 9,748,944 | B2 * | 8/2017 | Feng | H03K 17/145 |
| 10,008,276 | B2 * | 6/2018 | Huynh | G11C 29/025 |

\* cited by examiner

*Primary Examiner* — Thomas J. Hiltunen
(74) *Attorney, Agent, or Firm* — Slater Matsil, LLP

(57) ABSTRACT

In accordance with an embodiment, a circuit includes an RF switch, a leakage compensation circuit having a bias port and a reference port, a replica resistor coupled between a reference node and the reference port of the leakage compensation circuit, and a bias resistor coupled between the bias port of the leakage compensation circuit and a load path of the RF switch. The leakage compensation circuit configured to mirror a current from the bias port to the reference port, and apply a voltage from the reference port to the bias port.

29 Claims, 8 Drawing Sheets

SYSTEM AND METHOD FOR BIASING AN RF SWITCH

TECHNICAL FIELD

The present invention relates generally to electronic devices and, in particular embodiments, to a system and method for biasing a radio frequency (RF) switch.

BACKGROUND

RF switches are used in a variety of RF circuits to implement various functions. For instance, an RF system using different signaling methods over different frequencies may be implemented by using a network of antenna switches to select from between different types of RF front-end circuits. One example of such a circuit is a multi-standard cellular telephone that can make calls using different standards such as code division multiple access (CDMA) or Global System for Mobile Communications (GSM). By using an RF switch, an RF front end circuit optimized for CDMA communication may be used for CDMA calls, while an RF front end circuit optimized for GSM communication may be used for GSM calls. In addition, RF switches may be used to implement adjustable matching networks for antennas and power amplifiers, and to provide adjusting tuning for high frequency filters by switching in and out and/or bypassing passive matching and tuning elements.

As RF components are becoming more integrated in fine geometry integrated circuit processes, there are a number of technical challenges with respect to fabricating RF switches that have good high frequency performance. One such challenge is handling large voltage swings that may occur during the course of a signal transmission. In some cases, these voltage swings may exceed the breakdown voltages of the particular semiconductor process technology being used. One way in which this challenge is addressed is by stacking multiple devices and/or by using physically larger devices that may better withstand higher voltages. Another challenge to integrating RF switches involves managing the parasitic environment of the RF switch itself, as large devices used to withstand higher voltages may be prone to higher parasitic capacitances that may attenuate and/or degrade an RF signal. Examples of signal degradation include signal distortion caused by variations in bias voltage levels and parasitic capacitance over large signal swings.

SUMMARY

In accordance with an embodiment, a circuit includes an RF switch, a leakage compensation circuit having a bias port and a reference port, a replica resistor coupled between a reference node and the reference port of the leakage compensation circuit, and a bias resistor coupled between the bias port of the leakage compensation circuit and a load path of the RF switch. The leakage compensation circuit is configured to mirror a current from the bias port to the reference port, and apply a voltage from the reference port to the bias port.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention and do not limit the scope of the invention.

The present invention will be described with respect to embodiments in a specific context, namely a system and method of biasing an RF switch transistor. The invention may also be applied to systems and methods of biasing and/or generating reference voltage for other types of circuits and systems.

In accordance with an embodiment, a voltage for biasing a load path of an RF switch is provided via a bias resistor. A leakage compensation circuit is used to adjust the voltage applied to the bias resistor to compensate for voltage drops across the bias resistor caused by leakage current in the RF switch. In one example, the leakage compensation circuit compensates for this voltage drop by mirroring the leakage current from the bias resistor to a replica resistor and applying the voltage of the replica resistor to the bias resistor. Accordingly, the effect of bias voltage shifts due to changing leakage current is reduced. In some cases, the leakage compensation circuit may be operatively coupled to the RF switch solely through the bias resistor, thereby reducing distortion that could be caused by RF signals interacting with the parasitic capacitance of the leakage compensation circuit.

Figure 1:
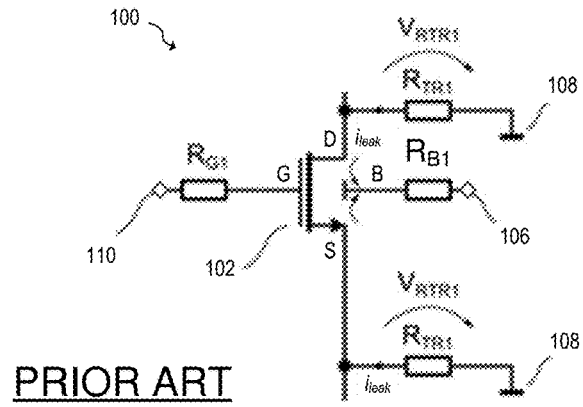
FIG. 1 illustrates a conventional biasing scheme for an RF switching transistor.

FIG. 1 illustrates a conventional biasing scheme 100 for a metal oxide semiconductor (MOS) RF switching transistor 102 that includes a source S, drain D, gate G and bulk B terminals. The conductive path between the source S and drain D terminals of RF switching transistor 102 can be referred to as the load path of RF switching transistor 102. As shown, the voltage of reference node 108 is applied to the source and drain of RF switching transistor 102 via high-ohmic bias resistors $R_{TR1}$. In addition, the voltage at gate biasing node no is applied to the gate of RF switching transistor 102 via high-ohmic gate bias resistor $R_{G1}$, and the voltage at bulk biasing node 106 is applied to the bulk of RF switching transistor 102 via high ohmic bulk bias resistor $R_{B1}$. In some cases, bias resistor $R_{B1}$ is implemented using the resistance of the bulk material of RF switching transistor 102 instead of or in addition to discrete resistor. The voltages of reference node 108 and bulk bias node 106 are applied to the source S, drain D and bulk B terminals of RF switching transistor 102, such that the drain-bulk and source-bulk regions of RF switching transistor 102 form reverse-biased pn-junctions.

Reverse-biased pn-junctions are known to generate a leakage current $i_{leak}$, which depends on the semiconductor material properties, doping profile, area of the pn-junction and temperature. Leakage current $i_{leak}$ flowing through the high-ohmic biasing resistors may cause a voltage drop $V_{RTR1}$ that shifts the DC voltage at terminals of RF switching transistor 102 away from the target value. Depending on the size of RF switching transistor 102, its operating conditions (including RF voltage amplitude, junction temperature etc.) and the value of high-ohmic bulk bias resistors $R_{B1}$, the voltage drop $V_{RTR1}$ across high-ohmic bias resistors $R_{TR1}$ may shift RF switching transistor 102 away from its desired operating point. Such a shift in operating point may become more pronounced when the value of high-ohmic bias resistors $R_{TR1}$ is in the mega-ohm range and the transistor width is around 10 mm. This leakage current $i_{leak}$ may occur in multiple integrated circuit technologies such as, but not limited to, silicon on substrate (SOI) and bulk complementary metal oxide semiconductor (bulk-CMOS).

Conventionally, MOS transistors in RF switch arrangements are DC-biased by means of high-ohmic resistors attached between their source, drain and gate terminals and a DC reference voltage. This DC reference voltage is generally fixed and does not change with the operating conditions of the RF switch. Thus, in some conventional RF switching circuits, excessive leakage current may cause a shift in the DC operating point of the RF switch. In cases where the leakage current is dependent on the applied RF voltage, signal distortion may result.

Figure 2A:
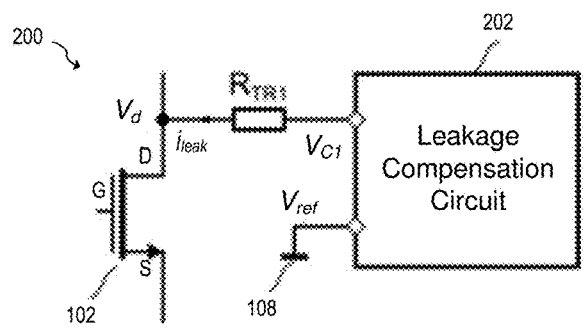
FIGS. 2A, 2B and 2C illustrate schematics of embodiment RF switch biasing circuits.

FIG. 2A illustrates a RF switch biasing circuit 200 according to an embodiment of the present invention. As shown, the drain D of RF switching transistor 102 is coupled to leakage compensation circuit 202 via high-ohmic bias resistor $R_{TR1}$. In various embodiments, leakage compensation circuit 202 measures leakage current $i_{leak}$ flowing through high-ohmic bias resistor $R_{TR1}$, and applies voltage $V_{C1}$ to high-ohmic bias resistor $R_{TR1}$ such that the resulting drain voltage $V_d$ applied to RF switching transistor 102 is substantially equal to the voltage at reference node 108. For example, $V_{c1}$ is set by leakage compensation circuit 202 according to:

$$V_{c1} = V_d + R_{TR1} \cdot i_{leak} = V_{ref} + R_{TR1} \cdot i_{leak}, \quad (1)$$

such that $V_{c1}$ is linearly-proportional to leakage current. In some embodiments, leakage compensation circuit 202 is coupled to RF switching transistor 102 via linear high-ohmic bias resistor $R_{TR1}$ and is not directly connected to source/drain nodes of the switch in order to reduce or eliminate the effect of non-linearities due to non-linear impedances (e.g., non-linear parasitic capacitances, device breakdown, forward biased diode junction, limited compliance ranges, etc.) of leakage compensation circuit 202. In various embodiments, high-ohmic bias resistor $R_{TR1}$ has a resistance between about 50 KΩ and about 1 MΩ. Alternatively, resistances outside of this range may also be used depending on the specific embodiment and its specifications.

Figure 2B:
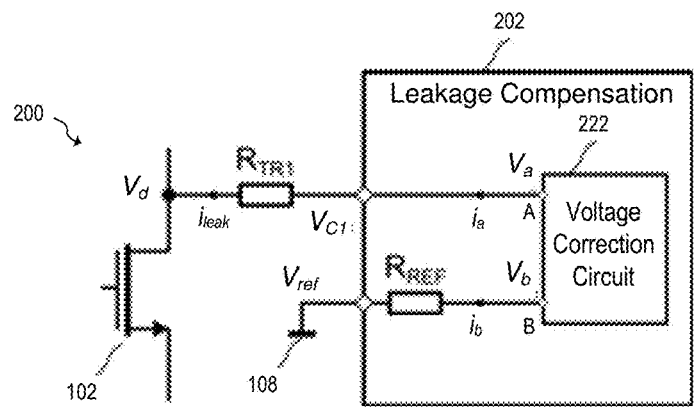

FIG. 2B illustrates a RF switch biasing circuit 200 in which leakage compensation circuit 202 is implemented using a voltage correction circuit 222 and replica resistor $R_{REF}$ that is connected between port B and reference voltage node 108. In various embodiments, voltage correction circuit 222 measures current $i_a$ flowing through high-ohmic bias resistor $R^{TR1}$ and produces a current $i_b$ that is proportional to measured current $i_a$. Voltage correction circuit 222 also applies the voltage $V_b$ at port B to port A such that $V_a = V_b$. If current $i_a$ is equal to current $i_b$ and the resistance of high-ohmic bias resistor $R_{TR1}$ is equal to the resistance of replica resistor $R_{REF}$, then voltage $V_d$ at the drain terminal of RF switching transistor 102 is equal to voltage $V_{ref}$ at reference node 108. Alternatively, the condition of $V_d = V_{ref}$ can be achieved by scaling resistor $R_{REF}$ by a factor of k and current $i_b$ by a factor of 1/k such that:

$$i_b = i_a/k \text{ and} \quad (2)$$

$$R_{REF} = kR_{TR1}, \quad (3)$$

where k>0.

Figure 2C:
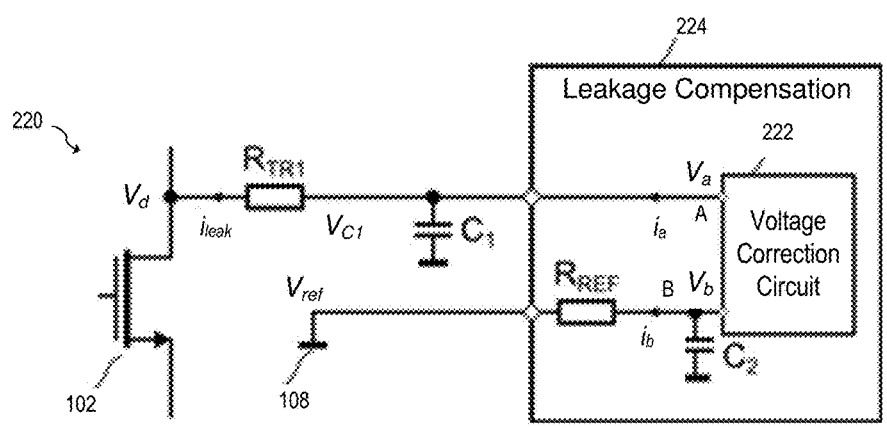

FIG. 2C illustrates RF switch biasing circuit 220, which is similar to RF switch biasing circuit 200 shown in FIG. 2B, with the exception that leakage compensation circuit 224 also includes capacitor $C_1$ coupled to port A of voltage correction circuit 222 and capacitor $C_2$ coupled to the port B of voltage correction circuit 222. In various embodiments, the combination of resistor $R_{TR1}$ and capacitor $C_1$ forms a first lowpass filter, and the combination of resistor $R_{REF}$ and capacitor $C_2$ forms a second lowpass filter that prevent high frequency RF signals at RF switching transistor 102 from feeding through to voltage correction circuit 222. In one example, when RF switching transistor 102 is used in systems that operate at RF frequencies between about 600 MHz and about 3.8 GHz, the values of resistor $R_{TR1}$, capacitor $C_1$, $R_{REF}$ and capacitor $C_2$ are set such that the first and second lowpass filters have a corner frequency at about 10 MHz. In such embodiments, the values of capacitors $C_1$ and $C_2$ may be between about 100 fF and about 10 pF. Alternatively, other cutoff frequencies or component values may be used depending on the particular system being implemented and its specifications.

Capacitors $C_1$ and $C_2$ may also be used to stabilize voltage correction circuit 222. In some embodiments, the capacitance of capacitor $C_2$ is set to have a value of two to four times larger than capacitor $C_1$ to provide stability of voltage correction circuit 222. Alternatively, other scaling ratios between capacitors $C_1$ and $C_2$ may be used.

Figure 3A:
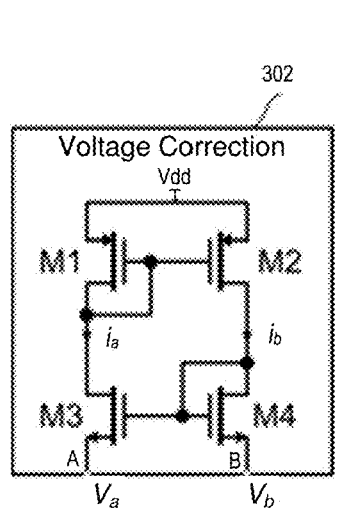
FIGS. 3A, 3B, 3C, 3D and 3E illustrate schematics of embodiment voltage correction circuits.

FIG. 3A illustrates an embodiment voltage correction circuit 302 that may be used to implement voltage correction circuit 222 shown in FIGS. 2B and 2C. As shown, voltage correction circuit 302 includes a current mirror having PMOS transistors M1 and M2. PMOS transistor M1 is coupled in a diode connected configuration and the gate of PMOS transistor M2 is connected to the gate of PMOS transistor M1. In addition, NMOS transistor M3 is connected in series with PMOS transistor M1 and diode connected transistor M4 is connected in series with PMOS transistor M2, with the gates of NMOS transistors M3 and M4 connected together.

During operation, the current mirror that includes PMOS transistors M1 and M2 mirrors current $i_a$ from port A to current $i_b$ at port B. Simultaneously, voltage $V_b$ at port B is transferred to voltage $V_a$ at port A via NMOS transistors M3 and M4. As such, NMOS transistors M3 and M4 can be referred to as a voltage mirror. In some embodiments, transistors M1 and M3 have an aspect ratio W/L larger than transistors M2 and M4 by a factor of k such that $i_a=ki_b$. Thus, when equations (2) and (3) are satisfied, $V_a=V_b$.

The leakage current $i_{leak}$ may vary considerably. For example, the magnitude of leakage current $i_{leak}$ may depend on the particular semiconductor process, the temperature, the bias conditions and the physical size of RF switching transistor 102. In some embodiments, leakage current $i_{leak}$ may range between 10 nA and 10 μA. Leakage currents outside of this range may also occur depending on the particular embodiments. However, at very low leakage currents, the discharge time of nodes A and B of voltage correction circuit 222 may increase.

Figure 3B:
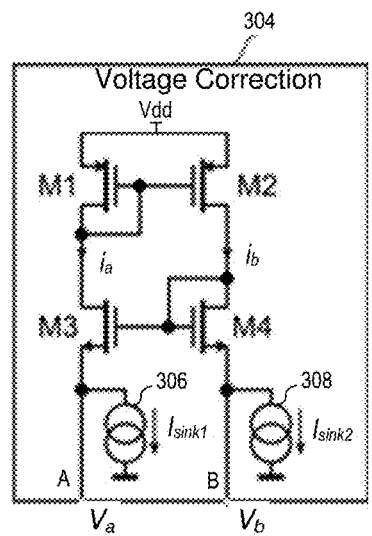

In some embodiments, voltage correction circuit 302 may be modified to include current sources 306 and 308 as shown with respect to voltage correction circuit 304 in FIG. 3B. As shown, current source 306 provides current $I_{sink1}$ to transistors M1 and M3 and current source 308 provides current $I_{sink2}$ to transistors M2 and M4. In various embodiments, these current sources help discharge ports A and B of voltage correction circuit 304 in cases where the leakage current is very low. By using current sources 306 and 308, the ability to discharge ports A and B of voltage correction circuit 304 can be made independent or less dependent on leakage current $i_{leak}$. In various embodiments, currents $I_{sink1}$ and $I_{sink2}$ are set to be between about −50 nA to about 5 μA, however, currents outside of this range may also be used.

In some embodiments, currents $I_{sink1}$ and $I_{sink2}$ are set to be equal to each other. In embodiments in which M1 and M3 are wider than transistors M2 and M4 by a factor of k, $I_{sink1}$ may be set to be equal to $kI_{sink2}$. Alternatively, other scaling factors may be used.

Figure 3C:
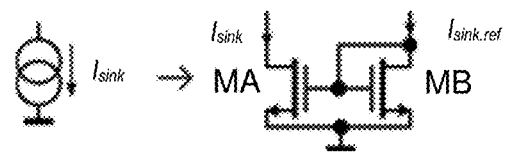

Current sources 306 and 308 may be implemented using current source circuits known in the art, for example, the NMOS current source shown in FIG. 3C. The NMOS current source includes a diode connected NMOS transistor MB and an NMOS current source transistor MA. As shown, the gates of NMOS transistors MA and MB are connected together. A reference current $I_{sink.ref}$ flows through diode connected NMOS transistor MB, which causes the gate-source voltage of diode connected NMOS transistor MB to attain a voltage that corresponds to reference current $I_{sink.ref}$. This gate-source voltage of gate-source voltage of diode connected NMOS transistor MB is applied to the gate of NMOS transistor MA and causes a corresponding current $I_{sink}$ to flow through NMOS transistor MA. When NMOS transistors MA and MB have the same aspect ratios, current $I_{sink}$ is approximately equal to reference current $I_{sink.ref}$. When NMOS transistor MA has an aspect ratio that is n time the ratio of NMOS transistor MB, current $I_{sink}=nI_{sink.ref}$. It should be understood that the NMOS current source shown in FIG. 3C is just one of many possible ways of implementing embodiments current sources. In alternative embodiments, other current source structures known in the art may be used.

Figure 3D:
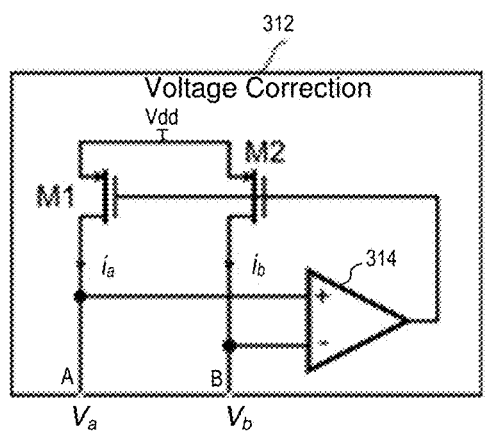

FIG. 3D illustrates a further embodiment voltage correction circuit 312 that may also be used to implement voltage correction circuit 222 shown in FIGS. 2B and 2C. As shown, voltage correction circuit 312 includes an active current mirror including amplifier 314 and PMOS transistors M1 and M2. In some embodiments, amplifier 314 is implemented using an operational amplifier. Alternatively, other amplifier types known in the art may be used.

During operation, the output of amplifier 314 adjusts the current through transistors M1 and M2 until voltage $V_a$ at port A becomes approximately equal to voltage $V_b$ at port B. Because the same output voltage of amplifier 314 is applied to the gates of both PMOS transistors M1 and M2, the currents through M1 and M2 will track each other. For example, when transistor M1 has an aspect ratio W/L larger than transistors M2 by a factor of k, $i_a=ki_b$.

Figure 3E:
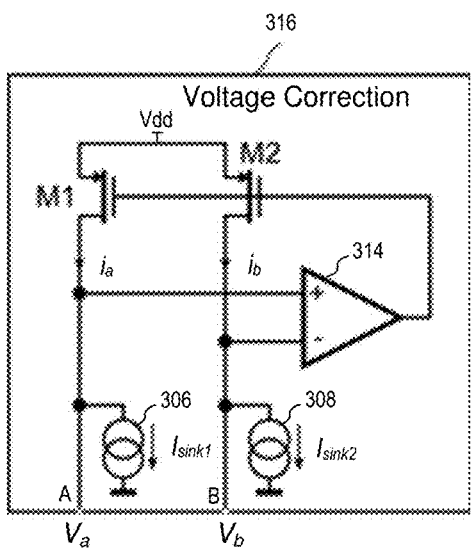

FIG. 3E illustrates voltage correction circuit 316 according to a further embodiment. Voltage correction circuit 316 is similar to voltage correction circuit 312 shown in FIG. 3D with the addition of current sources 306 and 308 that provide currents $I_{sink1}$ and $I_{sink2}$ that discharge ports A and B as described above with respect to FIGS. 3B and 3C. The circuits shown in FIGS. 3A-3E may be modified according to the particular application and its specifications. For example, in some embodiments, the polarity of the transistors M1, M2, M3 and M4 may be reversed such that current mirror transistors M1 and M2 are implemented as NMOS transistors and transistors M3 and M4 are implemented as PMOS transistors. Such embodiments may be applied in circuits having a negative voltage power supply. In further embodiments, some or all of transistors M1, M2, M3 and M4 may be implemented using other transistor technology types including, but not limited to JFETs, BJTs, IGBTs. In alternative embodiments, other circuit structures may be used to implement embodiment voltage correction circuits besides those shown in FIGS. 3A-3E.

Figure 4A:
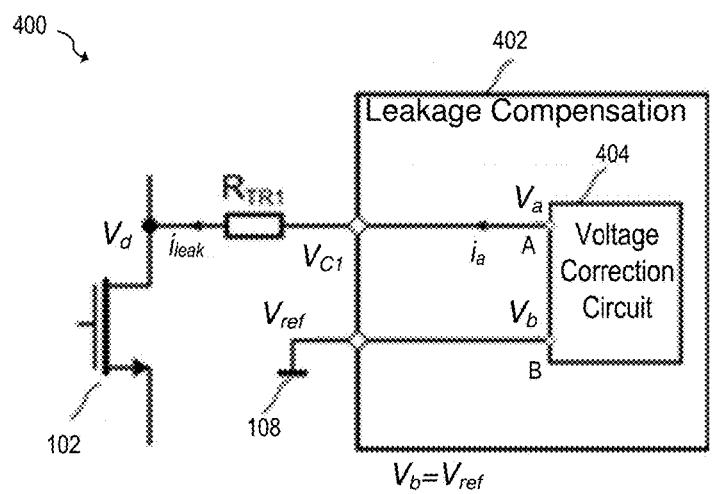
FIGS. 4A and 4B illustrate schematics of an RF switch biasing circuit according to an alternative embodiment.

FIG. 4A illustrates RF switch biasing circuit 400 according to a further embodiment. As shown, RF switch biasing circuit includes leakage compensation circuit 402 coupled to RF switching transistor 102 via resistor $R_{TR1}$. As shown, leakage compensation 402 includes voltage correction circuit 404, but does not include a resistor coupled between port B of voltage correction circuit 404 and reference node 108. In embodiments of the invention, port B of voltage correction circuit is set to voltage $V_b$ via reference node 108, and voltage correction circuit 404 is configured to set voltage $V_a$ to be $V_{ref}+i_aR_{TR1}$ in order to set drain voltage $V_d$ to be approximately equal to voltage $V_{ref}$.

Figure 4B:
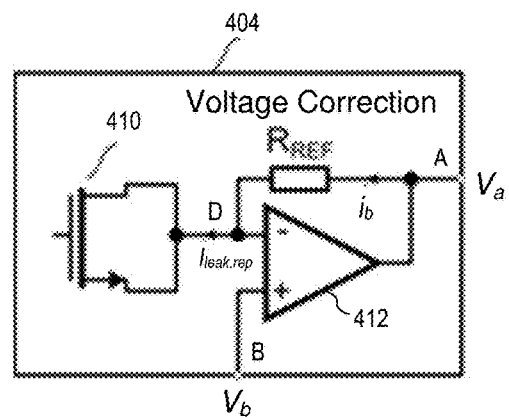

FIG. 4b illustrates a circuit implementation of voltage correction circuit 404 according to one implementation. As shown voltage correction circuit 404 includes replica transistor 410, amplifier 412 and reference resistor $R_{REF}$. In various embodiments, replica transistor 410 is a same type of transistor as RF switching transistor 102 and produces a leakage current $i_{leak.rep}$ that tracks the leakage current $i_{leak}$ of RF switching transistor 102. During operation, the feedback action of amplifier 412 and feedback resistor $R_{REF}$ forces the voltage at node D to have substantially the same voltage as voltage $V_b$ at port B of voltage correction circuit 404. Since current $i_b=i_{leak.rep}$ flows through resistor $R_{REF}$, the output voltage $V_a$ of amplifier 412 is about $V_b+i_{leak.rep}R_{REF}$, which provides the requisite compensation for RF switch biasing circuit 400 shown in FIG. 4A. In some embodiments, the value of $R_{REF}$ is a scaled version of resistor $R_{TR1}$, such that $$R_{REF} = R_{TR1}\frac{A_{102}}{A_{410}}, \tag{4}$$

where $A_{102}$ is the W/L ratio of transistor 102 and $A_{410}$ is the W/L ratio of transistor 410. Amplifier 412 may be implemented using an operational amplifier or other amplifier type known in the art.

Figure 5A:
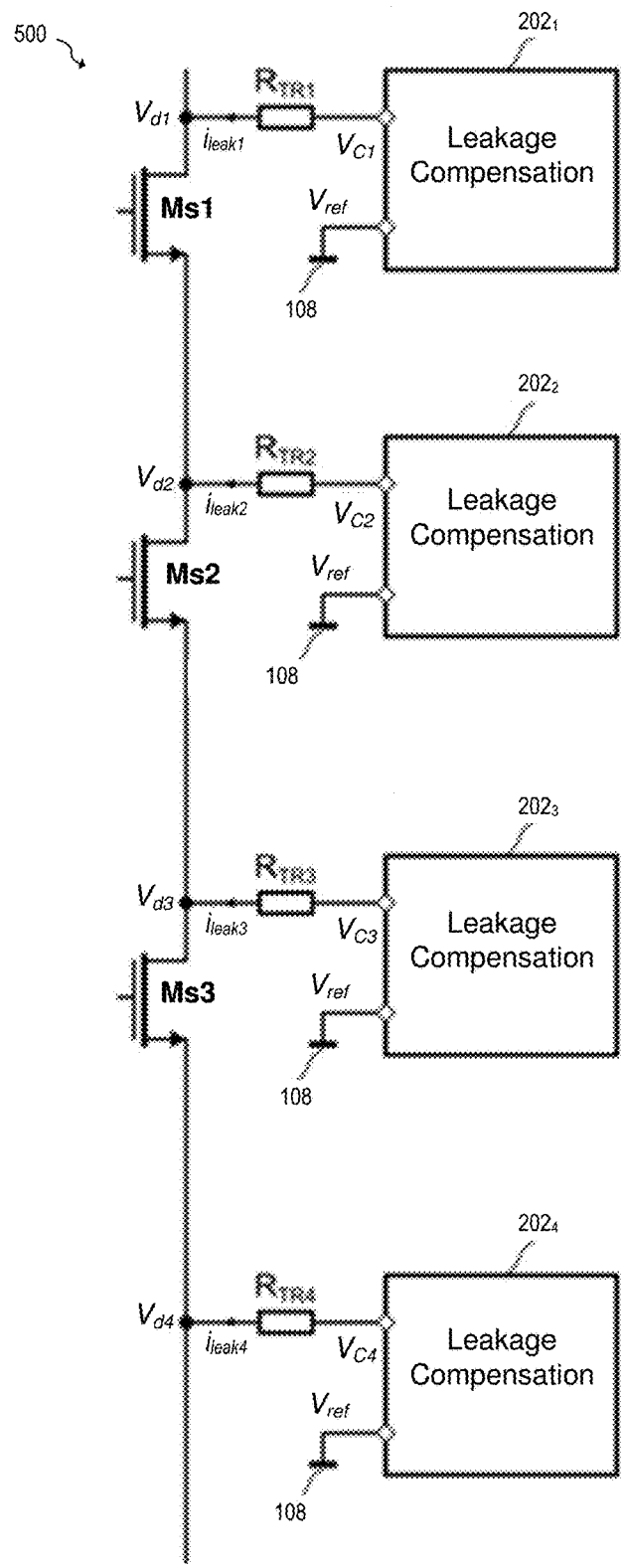
FIGS. 5A, 5B and 5C illustrate schematics of embodiment RF switch arrangements.

FIG. 5A illustrates an embodiment RF switch arrangement 500 in which the load paths of RF switching transistors Ms1, Ms2 and Ms3 coupled together in series and an embodiment leakage compensation circuit 202 is coupled to each source/drain region of each transistor Ms1, Ms2 and Ms3. For example, leakage compensation circuit $202_1$ is coupled to the drain of transistor Ms1 via bias resistor $R_{TR1}$, leakage compensation circuit $202_2$ is coupled to the source of transistor Ms1 and drain of transistor Ms2 via bias resistor $R_{TR2}$, leakage compensation circuit $202_3$ is coupled to the source of transistor Ms2 and drain of transistor Ms3 via bias resistor $R_{TR2}$, and leakage compensation circuit $202_4$ is coupled to the source of transistor Ms3 via bias resistor $R_{TR4}$. While only three transistors Ms1, Ms2 and Ms3 are shown for ease of illustration, it should be understood that any number of RF switching transistors may be coupled together in series along with any number of corresponding leakage compensation circuits 202. Leakage compensation circuits $202_1$, $202_2$, $202_3$, and $202_4$ may be implemented using any of the disclosed leakage compensation circuits disclosed herein, for example in FIGS. 2A-2C and 3A-3E. In alternative embodiments, $202_1$, $202_2$, $202_3$, and $202_4$ and corresponding resistors $R_{TR1}$, $R_{TR2}$, $R_{TR3}$ and $R_{TR4}$ may be implemented using leakage compensation circuits described in FIGS. 4A and 4B.

Figure 5B:
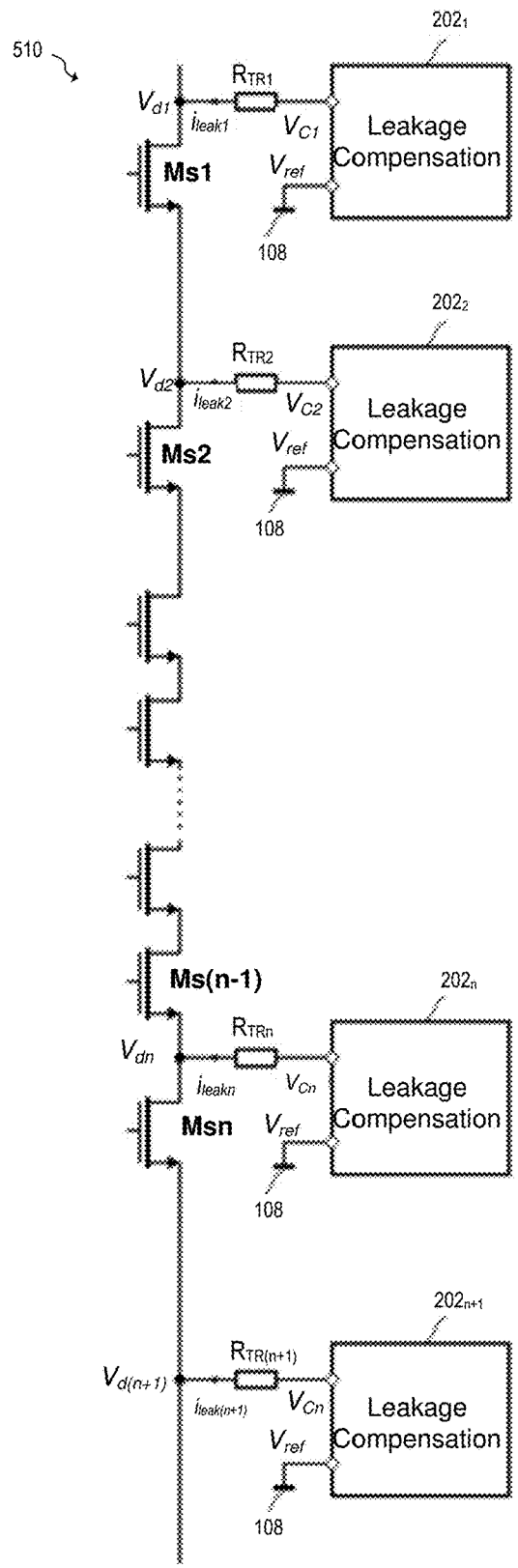

In some embodiments, leakage compensation circuits are coupled to only a subset of RF switching transistors, as shown in FIG. 5B that illustrates embodiment RF switch arrangement 510. As shown, leakage compensation circuit $202_1$ is coupled to the drain of transistor Ms1 via bias resistor $R_{TR1}$, leakage compensation circuit $202_2$ is coupled to the source of transistor Ms1 and drain of transistor Ms2 via bias resistor $R_{TR2}$, leakage compensation circuit $202_n$ is coupled to the source of transistor Ms(n−1) and drain of transistor Msn via bias resistor $R_{TRn}$, and leakage compensation circuit $202_{n+1}$ is coupled to the source of transistor Msn. In some embodiments greater or few leakage compensation circuits 202 may be used and/or may be coupled to other RF switching transistors besides Ms1, Ms2, Ms(n−1) and Msn. However, it is advantageous to couple leakage compensation circuits to the ends of the RF switching arrangement 510 as shown because the ends of RF switching arrangement 510 are generally the most prone to be exposed to large RF signal swings during operation.

Figure 5C:
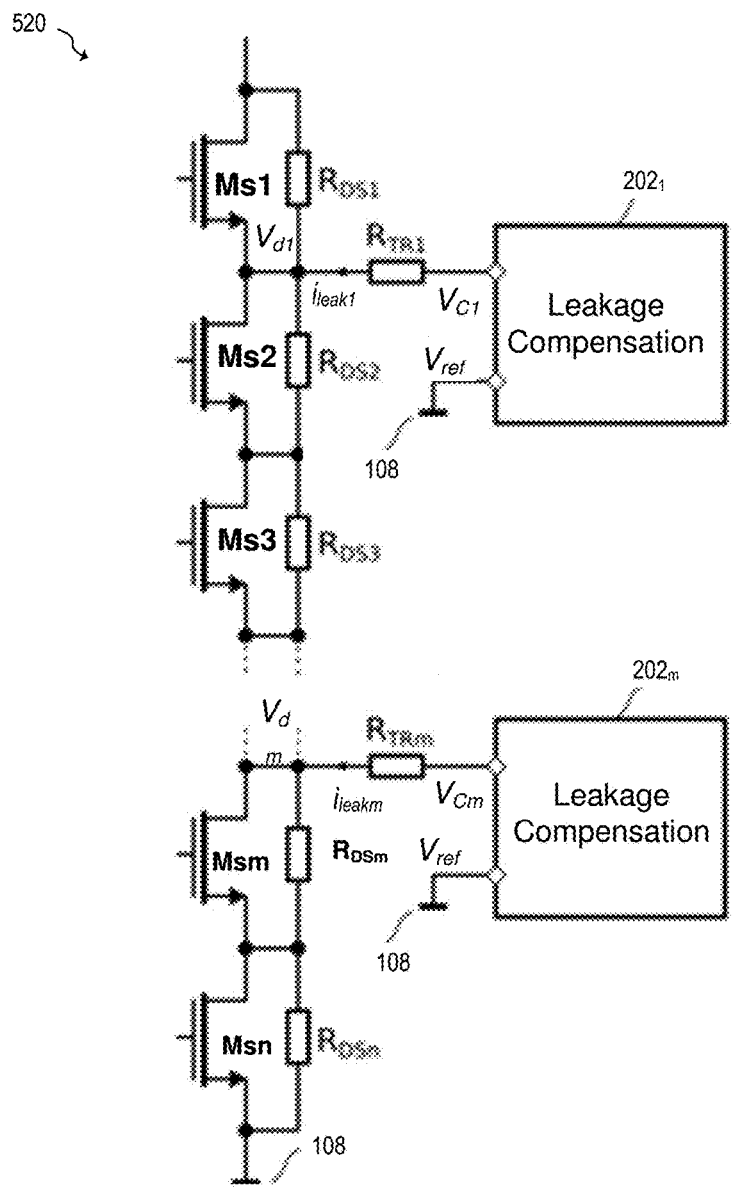

In some embodiments, leakage compensation circuit 202 may be distributed among the various RF switching transistors as shown in FIG. 5C, which illustrates RF switching arrangement 520 according to a further embodiment of the present invention. As shown, RF switching arrangement includes n RF switching transistors Ms1, Ms2, Ms3 ... Msm and Msn having load paths coupled in series. Each RF switching transistor Ms1, Ms2, Ms3 ... Msm and Msn has a corresponding coupling resistor $R_{Ds1}$, $R_{Dc2}$, $R_{DS3}$ ... $R_{Dsm}$ and $R_{DSn}$ coupled in parallel with its respective load path. As shown, a leakage compensation circuit 202 is connected to source/drain regions of a subject of RF switching transistor Ms1, Ms2, Ms3 ... Msm and Msn. As shown, leakage compensation circuit $202_1$ is coupled to the source of transistor Ms1 and the drain of transistor Ms2 via bias resistor $R_{TR1}$, and leakage compensation circuit $202_m$ is coupled to the drain of transistor Msm via bias resistor $R_{TRm}$. In some embodiments, leakage compensation circuits are coupled to one of every few RF switching transistors, such as to the drain/source node of every two, three or k RF switching transistors, where k is an integer greater than zero.

Coupling resistor $R_{DS1}$, $R_{DC2}$, $R_{DS3}$ ... $R_{DSm}$ and $R_{DSn}$ provide a high-ohmic bias to transistors, such as transistor Ms3 and Msn that are not directly coupled to one of leakage compensation circuits $202_1$ or $202m$. In some embodiments, resistors $R_{DS1}$, $R_{DS2}$, $R_{DS3}$ ... $R_{DSm}$ and $R_{DSn}$ each have a resistance of between about 1 kΩ and about 30 kΩ and resistors $R_{TR1}$ and $R_{TRm}$ has resistance of about 100 kΩ and about 1 MΩ. Alternatively, other resistance ranges may be used depending on the particular system and its implementations.

Figure 6:
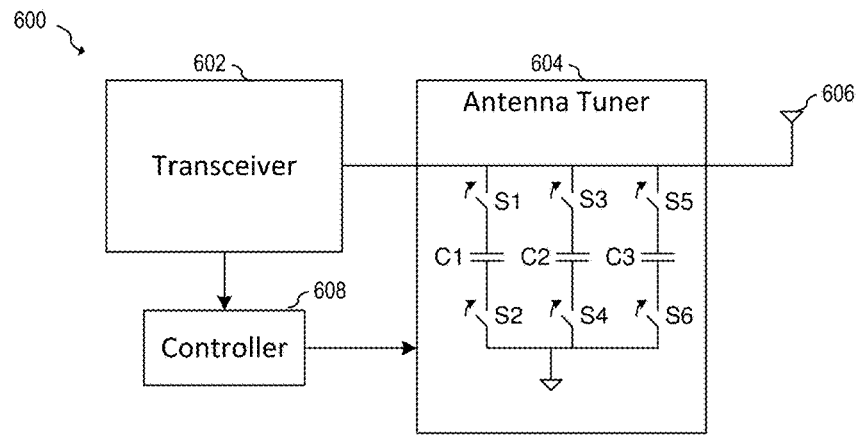
FIG. 6 illustrates a block diagram of an embodiment RF system that includes a transceiver, antenna tuner and an antenna.

FIG. 6 illustrates an RF system 600 that may be configured to utilize embodiment RF switching arrangements. As shown, RF system 600 includes an RF transceiver 602 coupled to an antenna 606 via antenna tuner 604. Antenna tuner includes shunt capacitors C1, C2 and C3 that can be selectively coupled to antenna 606 via switches S1, S2, S3, S4, S5 and S6. In various embodiments, switches S1, S2, S3, S4, S5 and S6 may be implemented using RF switching arrangements described herein. During operation, controller 608 provides control signals that selectively turns-on and turns-off switch S1, S2, S3, S4, S5 and S6 according to an antenna setting provided by transceiver 602. The switch configuration of antenna tuner may be used to provide an RF match between antenna 606 and transceiver 602 over a variety of frequencies. RF system 600 may be used, for example, in multi-band cellular communication applications. It should be understood that RF system 600 is just one of many application examples that can utilize embodiment RF switching arrangements.

Figure 7:
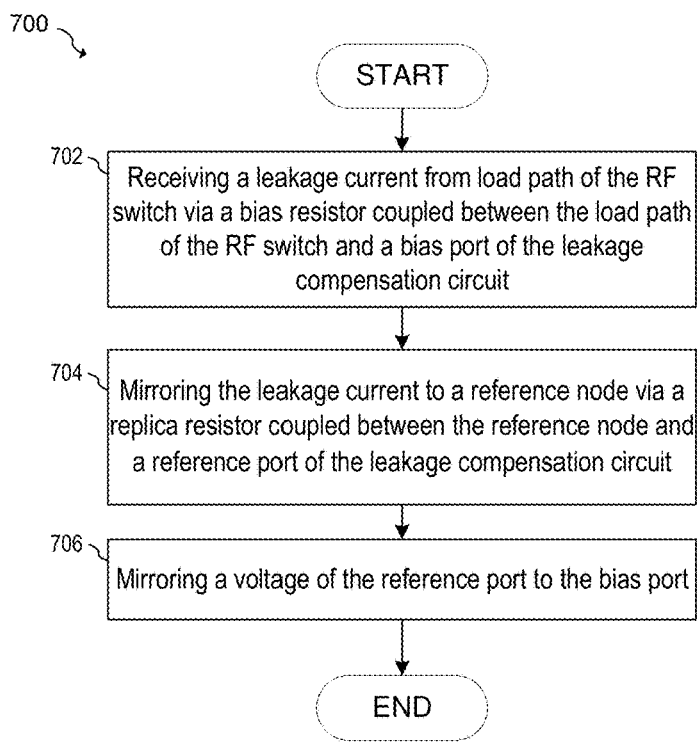
FIG. 7 illustrates a block diagram of an embodiment method.

FIG. 7 illustrates a flowchart of a method 700 of biasing an RF switch according to an embodiment of the present invention. In step 702, an embodiment leakage compensation circuit receives a leakage current from load path of the RF switch via a bias resistor coupled between the load path of the RF switch and a bias port of the leakage compensation circuit. In step 704, the leakage current is mirrored to a reference node via a replica resistor coupled between the reference node and a reference port of the leakage compensation circuit. A voltage of the reference port is mirrored to a bias port in step 706. The various leakage compensation circuits disclosed herein may be used to perform method 700.

Example embodiments of the present invention are summarized here. Other embodiments can also be understood from the entirety of the specification and the claims filed herein.

EXAMPLE 1

A circuit includes an RF switch; a leakage compensation circuit having a bias port and a reference port, the leakage compensation circuit configured to mirror a current from the bias port to the reference port, and apply a voltage from the reference port to the bias port; a replica resistor coupled between a reference node and the reference port of the leakage compensation circuit; and a bias resistor coupled between the bias port of the leakage compensation circuit and a load path of the RF switch.

EXAMPLE 2

The circuit of example 1, where a resistance of the replica resistor is a factor of k times a resistance of the bias resistor, and a current flowing from the reference port is a factor of 1/k times a current flowing from the bias port.

EXAMPLE 3

The circuit of one of examples 1 or 2, where the leakage compensation circuit includes a current mirror having an input coupled to the bias port and an output coupled to the reference port.

EXAMPLE 4

The circuit of example 3, where the leakage compensation circuit further includes a voltage mirror having an input device coupled between the reference port and the output of the current mirror and an output device coupled between the input of the current mirror and the bias port.

EXAMPLE 5

The circuit of one of examples 1 or 2, where the leakage compensation circuit includes a first transistor having a load path coupled to the bias port; and a second transistor having a load path coupled to the reference port, where a control node of the first transistor is coupled to a control node of the second transistor.

EXAMPLE 6

The circuit of example 5, where the leakage compensation circuit further includes an amplifier having a first input coupled to the bias port, a second input coupled to the reference port and an output coupled to the control node of the first transistor and the control node of the second transistor.

EXAMPLE 7

The circuit of example 5, where the leakage compensation circuit further includes a third transistor having a load path coupled between the bias port and the load path of the first transistor, where the first transistor is diode connected; and a fourth transistor having a load path coupled between the reference port and the load path of the second transistor, where the fourth transistor is diode connected.

EXAMPLE 8

The circuit of example 7, where the first transistor and second transistor are PMOS transistors, and the third transistor and fourth transistor are NMOS transistors.

EXAMPLE 9 the circuit of one of examples 1-8, further including a first current source coupled to the bias port, and a second current source coupled to the reference port.

EXAMPLE 10

The circuit of one of examples 1-9, further including a first capacitor coupled between the bias port and the reference node, and a second capacitor coupled between the reference port and the reference node.

EXAMPLE 11

The circuit of one of examples 1-10, wherein the load path of the RF switch is operatively coupled to the leakage compensation circuit solely through the bias resistor.

EXAMPLE 12

A method of biasing an RF switch including receiving, by a leakage compensation circuit, a leakage current from load path of the RF switch via a bias resistor coupled between the load path of the RF switch and a bias port of the leakage compensation circuit; mirroring, by the leakage compensation circuit, the leakage current to a reference node via a replica resistor coupled between the reference node and a reference port of the leakage compensation circuit; and mirroring a voltage of the reference port to the bias port.

EXAMPLE 13

The method of example 12, wherein receiving the leakage current includes receiving the leakage current using a first diode connected transistor coupled to the bias port; mirroring the leakage current includes mirroring the leakage current using a first mirror transistor having a control node coupled to the first diode connected transistor and a load path coupled to the reference port; and mirroring the voltage includes measuring the voltage of the reference port using a second diode connected transistor coupled between the reference port and the first mirror transistor and applying the mirrored voltage to the bias port using a second mirror transistor having a control node coupled to the second diode connected transistor and a load path coupled between the first diode connected transistor and the bias port.

EXAMPLE 14

The method of example 12, where receiving the leakage current includes receiving the leakage current using a first transistor having a load path coupled to the bias port; mirroring the leakage current includes producing a compensating current using a second transistor having a load path coupled to the reference port and a control node coupled to a control node of the first transistor; and mirroring the voltage includes using an amplifier having a first input coupled to the reference port, a second input coupled to the bias port and an output coupled to the control node of the first transistor and the second transistor, where the amplifier causes a voltage of the bias port to approach the voltage of the reference port.

EXAMPLE 15

The method of one of claims 12-14, where the load path of the RF switch is operatively coupled to the leakage compensation circuit solely through the bias resistor.

EXAMPLE 16

The method of claim 15, where the RF switch includes a plurality of series connected transistors and a plurality of leakage compensation circuits coupled to corresponding load paths of the series connected transistors.

EXAMPLE 17

An RF switch including a plurality of switching transistors having load paths coupled in series and a plurality of bias circuits. Each of the plurality of bias circuits has a bias output node connected to a corresponding load path of a corresponding switching transistor of the plurality of switching transistors, and each of the plurality of bias circuits includes: a leakage compensation circuit having a bias port and a reference port, where the leakage compensation circuit is configured to mirror a current from the bias port to the reference port and apply a voltage from the reference port to the bias port; a replica resistor coupled between a reference node and the reference port of the leakage compensation circuit, and a bias resistor coupled between the bias port of the leakage compensation circuit and the bias output node.

EXAMPLE 18

The RF switch of example 17, where the load path of each of the plurality of switching transistors is connected to a corresponding bias circuit of the plurality of bias circuits.

EXAMPLE 19

The RF switch of example 17, where the load path of a subset of the plurality of switching transistors is connected to a corresponding bias circuit of the plurality of bias circuits.

EXAMPLE 20

The RF switch of example 19, where the subset of the plurality of switching transistors are located at ends of the RF switch.

EXAMPLE 21

The RF switch of example 19, where the subset of the plurality of switching transistors are distributed along a length of the RF switch.

EXAMPLE 22

The RF switch of example 21, where each transistor of the plurality of switching transistors includes a resistor coupled in parallel with its respective load path.

EXAMPLE 23

The RF switch of one of examples 17-22, where the switching transistors include MOSFETs and the load path of each switching transistor includes a channel coupled between a source and drain of each switching transistor.

EXAMPLE 24

A circuit including a leakage compensation circuit having a bias port and a reference port. The leakage compensation circuit includes a leakage replica circuit configured to provide a leakage current proportional to a leakage current of a first circuit; an amplifier having a first input coupled to the leakage replica circuit, a second input coupled to the reference port, and an output coupled to the bias port; a replica resistor coupled between the first input of the amplifier and the bias port; and a bias resistor coupled between the bias port of the leakage compensation circuit and a bias output node configured to provide a bias voltage to the first circuit.

EXAMPLE 25

The circuit of example 24, further including the first circuit, where the first circuit includes an RF switch, and the leakage replica circuit includes a replica RF switch.

EXAMPLE 26

The circuit of one of examples 24 and 25, where the bias output node is operatively coupled to the leakage compensation circuit solely through the bias resistor.

Advantages of embodiments include the ability to bias an RF switch transistor, such as a MOS transistor, using a high-ohmic resistor without leakage-current induced bias point shifts. Embodiments of the present invention that compensate for the effect of leakage current may also advantageously reduce RF signal distortion.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
    an RF switch;
    a leakage compensation circuit having a bias port and a reference port, the leakage compensation circuit configured to mirror a current from the bias port to the reference port, and apply a voltage from the reference port to the bias port;
    a replica resistor coupled between a reference node and the reference port of the leakage compensation circuit, wherein a current flowing through the replica resistor is configured to be proportional to the current from the bias port; and
    a bias resistor direct current (DC) coupled between the bias port of the leakage compensation circuit and a load path of the RF switch.

2. The circuit of claim 1, wherein a resistance of the replica resistor is a factor of k times a resistance of the bias resistor, and the current flowing from the reference port through the replica resistor is a factor of 1/k times the current flowing from the bias port.

3. The circuit of claim 1, wherein the leakage compensation circuit comprises a current mirror having an input coupled to the bias port and an output coupled to the reference port.

4. The circuit of claim 3, wherein the leakage compensation circuit further comprises a voltage mirror having an input device coupled between the reference port and the output of the current mirror and an output device coupled between the input of the current mirror and the bias port.

5. The circuit of claim 1, wherein the leakage compensation circuit comprises:
    a first transistor having a load path coupled to the bias port; and
    a second transistor having a load path coupled to the reference port, wherein a control node of the first transistor is coupled to a control node of the second transistor.

6. The circuit of claim 5, wherein the leakage compensation circuit further comprises an amplifier having a first input coupled to the bias port, a second input coupled to the reference port and an output coupled to the control node of the first transistor and the control node of the second transistor.

7. The circuit of claim 5, wherein the leakage compensation circuit further comprises:
    a third transistor having a load path coupled between the bias port and the load path of the first transistor, wherein the first transistor is diode connected; and
    a fourth transistor having a load path coupled between the reference port and the load path of the second transistor, wherein the fourth transistor is diode connected.

8. The circuit of claim 7, wherein the first transistor and second transistor are PMOS transistors, and the third transistor and fourth transistor are NMOS transistors.

9. The circuit of claim 1, further comprising a first current source coupled to the bias port, and a second current source coupled to the reference port.

10. The circuit of claim 1, further comprising a first capacitor coupled between the bias port and the reference node, and a second capacitor coupled between the reference port and the reference node.

11. The circuit of claim 1, wherein the load path of the RF switch is operatively coupled to the leakage compensation circuit solely through the bias resistor.

12. The circuit of claim 1, wherein the leakage compensation circuit comprises:
a first diode connected transistor coupled to the bias port;
a first mirror transistor having a control node coupled to the first diode connected transistor and a load path coupled to the reference port;
a second diode connected transistor coupled between the reference port and the first mirror transistor; and
a second mirror transistor having a control node coupled to the second diode connected transistor and a load path coupled between the first diode connected transistor and the bias port.

13. The circuit of claim 12, wherein the first diode connected transistor and the first mirror transistor are PMOS transistors, and the second diode connected transistor and the second mirror transistor are NMOS transistors.

14. A method of biasing an RF switch, the method comprising:
receiving, by a leakage compensation circuit, a leakage current from a load path of the RF switch via a bias resistor direct current (DC) coupled between the load path of the RF switch and a bias port of the leakage compensation circuit;
mirroring, by the leakage compensation circuit, the leakage current to a reference node via a replica resistor coupled between the reference node and a reference port of the leakage compensation circuit, wherein a current flowing through the replica resistor is proportional to the leakage current from the load path of the RF switch; and
mirroring a voltage of the reference port to the bias port.

15. The method of claim 14, wherein:
receiving the leakage current comprises receiving the leakage current using a first diode connected transistor coupled to the bias port;
mirroring the leakage current comprises mirroring the leakage current using a first mirror transistor having a control node coupled to the first diode connected transistor and a load path coupled to the reference port; and
mirroring the voltage comprises measuring the voltage of the reference port using a second diode connected transistor coupled between the reference port and the first mirror transistor and applying the mirrored voltage to the bias port using a second mirror transistor having a control node coupled to the second diode connected transistor and a load path coupled between the first diode connected transistor and the bias port.

16. The method of claim 14, wherein:
receiving the leakage current comprises receiving the leakage current using a first transistor having a load path coupled to the bias port;
mirroring the leakage current comprises producing a compensating current using a second transistor having a load path coupled to the reference port and a control node coupled to a control node of the first transistor; and mirroring the voltage comprises using an amplifier having a first input coupled to the reference port, a second input coupled to the bias port and an output coupled to the control node of the first transistor and the second transistor, wherein the amplifier causes a voltage of the bias port to approach the voltage of the reference port.

17. The method of claim 14, wherein the load path of the RF switch is operatively coupled to the leakage compensation circuit solely through the bias resistor.

18. The method of claim 17, wherein the RF switch comprises a plurality of series connected transistors and a plurality of leakage compensation circuits coupled to corresponding load paths of the series connected transistors.

19. An RF switch comprising:
a plurality of switching transistors having load paths coupled in series; and
a plurality of bias circuits, each of the plurality of bias circuits having a bias output node connected to a corresponding load path of a corresponding switching transistor of the plurality of switching transistors, each of the plurality of bias circuits comprising
a leakage compensation circuit having a bias port and a reference port, the leakage compensation circuit configured to mirror a current from the bias port to the reference port, and apply a voltage from the reference port to the bias port,
a replica resistor coupled between a reference node and the reference port of the leakage compensation circuit, a current flowing through the replica resistor is configured to be proportional to the current from the bias port, and
a bias resistor direct current (DC) coupled between the bias port of the leakage compensation circuit and the bias output node.

20. The RF switch of claim 19, wherein the load path of each of the plurality of switching transistors is connected to a corresponding bias circuit of the plurality of bias circuits.

21. The RF switch of claim 19, wherein the load path of a subset of the plurality of switching transistors is connected to a corresponding bias circuit of the plurality of bias circuits.

22. The RF switch of claim 21, wherein the subset of the plurality of switching transistors is located at ends of the RF switch.

23. The RF switch of claim 21, wherein the subset of the plurality of switching transistors are distributed along a length of the RF switch.

24. The RF switch of claim 23, wherein each transistor of the plurality of switching transistors comprises a resistor coupled in parallel with its respective load path.

25. The RF switch of claim 19, wherein:
the switching transistors comprise MOSFETS; and
the load path of each switching transistor comprises a channel coupled between a source and drain of each switching transistor.

26. The RF switch of claim 19, wherein the leakage compensation circuit comprises:
a first transistor having a load path coupled to the bias port, wherein the first transistor is diode connected;
a second transistor having a load path coupled to the reference port, wherein a control node of the first transistor is coupled to a control node of the second transistor;
a third transistor having a load path coupled between the bias port and the load path of the first transistor; and a fourth transistor having a load path coupled between the reference port and the load path of the second transistor, wherein the fourth transistor is diode connected.

27. The RF switch of claim 26, wherein the first transistor and second transistor are PMOS transistors, and the third transistor and fourth transistor are NMOS transistors.

28. A leakage compensation circuit comprising:
a bias port configured to be coupled to a load path of an RF switch via a bias resistor and a reference port configured to be direct current connected to a reference node via a replica resistor, the leakage compensation circuit comprising:
a first diode connected transistor coupled to the bias port;
a first mirror transistor having a control node coupled to the first diode connected transistor and a load path coupled to the reference port;
a second diode connected transistor coupled between the reference port and the first mirror transistor; and
a second mirror transistor having a control node coupled to the second diode connected transistor and a load path coupled between the first diode connected transistor and the bias port.

29. The leakage compensation circuit of claim 28, wherein the first diode connected transistor and the first mirror transistor are PMOS transistors, and the second diode connected transistor and the second mirror transistors are NMOS transistors.

* * * * *